(12) United States Patent
Colella et al.

(10) Patent No.: US 7,157,309 B2
(45) Date of Patent: Jan. 2, 2007

(54) MANUFACTURE OF MICROELECTRONIC FOLD PACKAGES

(75) Inventors: Nicholas J. Colella, Pleasanton, CA (US); Giles Humpston, San Jose, CA (US)

(73) Assignee: Tessera, Inc., San Jose, CA (US)

( * ) Notice: Subject to any disclaimer, the term of this patent is extended or adjusted under 35 U.S.C. 154(b) by 38 days.

(21) Appl. No.: 10/950,241

(22) Filed: Sep. 27, 2004

(65) Prior Publication Data

US 2005/0227410 A1 Oct. 13, 2005

Related U.S. Application Data

(60) Provisional application No. 60/561,211, filed on Apr. 9, 2004.

(51) Int. Cl.
*H01L 21/44* (2006.01)
(52) U.S. Cl. .................. 438/106; 438/62; 438/109; 257/686; 257/723; 257/724; 257/725; 257/E21.499
(58) Field of Classification Search ................ 438/109
See application file for complete search history.

(56) References Cited

U.S. PATENT DOCUMENTS

| | | | |
|---|---|---|---|
| 4,814,855 A * | 3/1989 | Hodgson et al. ........... 174/52.4 |
| 6,121,676 A | 9/2000 | Solberg | |
| 6,225,688 B1 | 5/2001 | Kim et al. | |
| 6,699,730 B1 | 3/2004 | Kim et al. | |
| 2003/0168725 A1 | 9/2003 | Warner et al. | |
| 2004/0099938 A1 | 5/2004 | Kang et al. | |
| 2004/0115866 A1 | 6/2004 | Bang et al. | |
| 2004/0145054 A1 | 7/2004 | Bang et al. | |
| 2004/0209400 A1 * | 10/2004 | Meyers ........................ 438/109 |
| 2004/0238931 A1 | 12/2004 | Haba et al. | |

FOREIGN PATENT DOCUMENTS

| WO | WO-2004/017399 | 2/2004 |
| WO | WO-2004/023546 | 3/2004 |
| WO | WO-2004/025699 | 3/2004 |

OTHER PUBLICATIONS

Bang et al., U.S. Appl. No. 10/640,177, filed Aug. 13, 2003.
Fjelstad, U.S. Appl. No. 10/077,388, filed Feb. 15, 2002.
Humpston et al. U.S. Appl. No. 60/549,176, filed Mar. 1, 2004.
Humpston et al., U.S. Appl. No. 60/561,210, filed Apr. 9, 2004.
Thompson et al., U.S. Appl. No. 10/969,527, filed Oct. 20, 2004.

* cited by examiner

*Primary Examiner*—Michael Lebentritt
*Assistant Examiner*—Kyoung Lee
(74) *Attorney, Agent, or Firm*—Lerner, David, Littenberg, Krumholz & Mentlik, LLP (57) ABSTRACT

An elongated strip of a sheetlike substrate bearing microelectronic elements such as semiconductor chips is advanced in a downstream direction through one or more folding stations where successive portions of the substrate are folded so as to form a strip including a plurality of fold packages, each including confronting top and bottom runs and a fold region with one or more of the runs bearing one or more microelectronic elements. The strip incorporating the plural fold packages can be wound on a reel or otherwise handled, stored and shipped to a subsequent manufacturing operation, where individual fold packages can be severed from the strip.

34 Claims, 7 Drawing Sheets

MANUFACTURE OF MICROELECTRONIC FOLD PACKAGES

CROSS-REFERENCE TO RELATED APPLICATIONS

This application claims the benefit of the filing date of U.S. Provisional Patent Application No. 60/561,211, filed Apr. 9, 2004, the disclosure of which is incorporated by reference herein.

BACKGROUND OF THE INVENTION

The present invention relates to microelectronic packaging and more particularly relates to fold packages for microelectronic elements, methods of making such packages and semi-finished assemblies and sets of such packages.

SUMMARY OF THE INVENTION

Microelectronic elements such as semiconductor chips or "dies" commonly are provided in packages which protect the die or other element from physical damage, and which facilitate mounting of the die on a circuit panel or other element. One type of microelectronic package includes a substrate, also referred to as a "tape" incorporating a dielectric layer such as a layer of a polyimide, BT resin or other polymeric material with electrically-conductive features such as terminals on the dielectric element. The die is mounted on the substrate so that a face of the die confronts the substrate, typically with a layer of a die attach adhesive between the die and the substrate. The terminals are exposed at an outer surface of the substrate, but are electrically connected to contacts on the die itself. A protective material commonly referred to as an overmolding may surround the die itself, but desirably does not cover the terminals. Such a package can be mounted on a circuit board with the outer surface of the substrate facing toward the circuit board, and with the terminals aligned with contact pads on the circuit board. Conductive bonding materials such as solder balls can be used to bond the terminals to the contact pads, so as to physically mount the package in place on the board and connect the terminals to the circuitry of the board, thereby connecting the die to the circuitry. When the package is mounted to the circuit board, the substrate lies beneath the die, between the die and the circuit board.

As disclosed, for example, in copending, commonly assigned U.S. patent application Ser. No. 10/281,550, filed Oct. 28, 2002 and published on Sep. 11, 2003 as Publication No. US2003/0168725; Ser. No. 10/077,388, filed Feb. 15, 2002; Ser. No. 10/654,375, filed Sep. 3, 2003 and published on Jun. 17, 2004 as Publication No. US2004/0115866; Ser. No. 10/655,952, filed Sep. 5, 2003 and published on May 27, 2004 as Publication No. US2004/0099938; Ser. No. 10/640,177, filed Aug. 13, 2003; Ser. No. 10/656,534, filed Sep. 5, 2003 and published on Jul. 29, 2004 as Publication No. US2004/0145054; Ser. No. 10/448,515, filed May 30, 2003 and published on Dec. 2, 2004 as Publication No. US2004/0238931; U.S. patent application Ser. No. 10/969,527, filed Oct. 20, 2004; in commonly assigned Published PCT International Application Nos. WO 2004/017399, filed Aug. 13, 2003 and published on Feb. 26, 2004; WO 2004/023546, filed Sep. 5, 2003 and published on Mar. 18, 2004; and WO 2004/025699, filed Sep. 8, 2003 and published on Mar. 25, 2004, and in U.S. Patent Nos. 6,121,676 and 6,699,730, the disclosures of all of the foregoing issued patents and pending applications being incorporated by reference herein, a package referred to herein as a "fold" package incorporates a generally similar substrate or tape. However, the substrate or tape in a fold package is folded so as to define a pair of superposed runs extending in generally parallel planes. One such run extends below the die, in the position occupied by the substrate of the conventional package, whereas the other run extends above the die, with tho die disposed between the runs. The bottom run typically bears terminals used to mount the package to a circuit panel or other larger substrate. In some variants of the fold package, electrically conductive components on the top run include terminals exposed at the outer surface (the surface facing upwardly away from the die and away from the bottom run), so that other packaged or unpackaged microelectronic elements can be mounted on the top run of the fold package. Fold packages of this type can be stacked, one on top of the other. The features on the top run are interconnected with the terminals or other electrically-conductive features on the bottom run by traces extending along the dielectric element. These traces extend around the fold formed in the dielectric element. In some embodiments, the contacts on the die disposed between the runs are connected to bond pads on the top run, and the traces connect these bond pads to terminals on the bottom run.

In a further variant, two or more microelectronic elements such as two or more semiconductor dies are mounted in the space between the top and bottom runs.

Still other fold packages combine these approaches, so that two or more microelectronic elements are disposed in the space between the top and bottom runs of the package, and the package has exposed terminals on both the top run and the bottom run, and hence can be stacked or otherwise combined with additional packages of the same or different types and/or with additional microelectronic elements.

Fold packages provide certain significant advantages. The traces which extend between the top and bottom runs can be formed in the normal tape-fabrication process at little additional cost, so as to provide low-cost, reliable interconnections between the two runs. The folded substrate substantially surrounds the die or other elements between the runs, and thus provides additional physical protection to these elements. Also, the substrate can include electrically conductive elements which provide electromagnetic shielding around the die or other elements disposed between the runs.

As described in certain embodiments of the co-pending, commonly assigned U.S. Provisional Patent Application No. 60/549,176, filed Mar. 1, 2004, and naming Giles Humpston, Phillip R. Osborn and Jesse Thompson as inventors, the disclosure of which is incorporated by reference herein, a micro-electromechanical device incorporated in a die may be mounted in a fold package. Where the device includes a microphone or other transducer, the fold package may be provided with an opening in one run of the substrate for admitting sound waves or other phenomena to be detected or measured by the transducer. The fold package may additionally define an acoustic cavity for use in conjunction with a microphone. As disclosed in certain embodiments of the co-pending commonly assigned U.S. Provisional Patent Application No. 60/561,210, filed Apr. 9, 2004, naming Giles Humpston as the inventor, the disclosure of which is incorporated by reference herein and a copy of which is attached hereto as Attachment 2 and forms a part hereof, a fold package used with a die sensitive to electromagnetic radiation may include a window transmissive to such radiation but adapted to physically protect the die.

Despite all of these advances in the art, however, still further improvement would be desirable. In particular, it would be desirable to provide methods of fabricating and using fold packages which facilitate fabrication and use of such packages in large volume production at low cost.

SUMMARY OF THE INVENTION

One aspect of the invention provides methods of forming a plurality of microelectronic packages. A method according to this aspect of the invention desirably includes the steps of advancing a strip of a sheetlike substrate in a downstream direction through one or more folding stations; and, folding the substrate at the folding stations so that portions of the substrate form folded packaging elements, each including a top run and a bottom run.

The folding step may include engaging successive regions of the sheet referred to herein as lift regions with at least one lifting element defining at least one surface extending in the downstream direction and sloping in an upward direction transverse to the downstream direction and transverse to the lateral or widthwise direction of the strip. In this arrangement, as each such lift region moves downstream, such lift region will be lifted progressively upwardly by the lifting element. The folding step may further include engaging guide regions of the substrate laterally offset from the lift regions with one or more guide elements disposed above the sheet. The guide elements limit upward movement of the guide regions, so that the substrate is folded about one or more fold axes extending in the downstream direction.

In other methods according to this aspect of the invention, the strip may have flaps defined by gaps extending through the thickness of the strip. The gaps may be formed during the downstream advance of the strip. The gaps may extend around three sides of a generally rectangular flap so that the flap has a juncture with the other portions of the strip, such juncture extending along the fourth side of the rectangular flap. The folding step may include lifting the flaps so that each flap is bent relative to other regions of the substrate about a juncture between the flap the other regions and so that portions of the flap remote from such juncture are lifted upwardly away from the other regions of the strip. The lifting operation may be performed by advancing a tool upwardly, transverse to the thickness of the strip.

Alternatively or additionally, where the flaps point in the downstream direction and the junctures extend in the lateral direction, the lifting operation may include moving the strip around a drum or other element so as to bend the strip about an axis extending laterally. As the strip is bent, the flaps will project upwardly from the other regions of the strip. Further advance of the strip may cause the downstream ends of the flaps to engage a flattening tool so that the downstream motion of the strip causes the flattening tool to bend the flaps back upstream relative to the other regions of the strip.

Methods as discussed above can be applied to continuous strips of indefinite length. The strips can be fed downstream in continuous or intermittent motion. The most preferred methods according to this aspect of the invention provide economical and efficient ways of forming fold packages. Prior to folding, the strip may bear the microelectronic elements to be included in the fold packages.

A further aspect of the present invention provides an article including a plurality of microelectronic packages, each such package incorporating a package element including a portion of a substrate folded so as to include top and bottom runs and a fold portion connecting said runs, each said package further including at least one microelectronic element attached to at least one of said runs, the packages being connected to one another so as to form a flexible strip of indefinite length. Such a strip of fold packages may be formed, for example, by the processes discussed above. The strip of fold packages may be bent or wrapped in spiral fashion, as, for example, on a reel. Such an article provides fold packages in a form well suited to automatic feeding in subsequent manufacturing operations. In the subsequent manufacturing operations, the strip can be advanced and individual packages can be severed from the strip.

A further aspect of the present invention provides further methods of producing microelectronic packages. Methods according to this aspect of the invention include forming first and second sets of packages. Each package includes a package element having a top run, a bottom run, a fold connecting said top and bottom runs and terminals on one of said runs, as well as a semiconductor die attached to one of said runs and electrically connected to the terminals of that package. The terminals of the packages in the first and second sets desirably are disposed in the same pattern. The packages of the first set include first semiconductor dies, whereas the packages of the second set include second semiconductor dies substantially identical in function to the first dies but having at least one horizontal dimension smaller than a corresponding horizontal dimension of the first dies. Thus packages of both sets can be mounted interchangeably, despite differences in die sizes. Methods according to this aspect of the invention thus can effectively deal with "die shrink" or changes in die dimensions due to improved die manufacturing processes while still maintaining interchangeability between packages containing different dies.

The package elements in the second set may be substantially identical to the package elements in the first set of packages. The terminals of the package elements, and bond pads used to connect the dies to the package elements, may be disposed in zones of the package elements adjacent the folds. The package elements may include energy-transmissive windows such as openings for transmitting acoustic or optical energy to or from the die.

DESCRIPTION OF THE PREFERRED EMBODIMENTS

Figure 1:
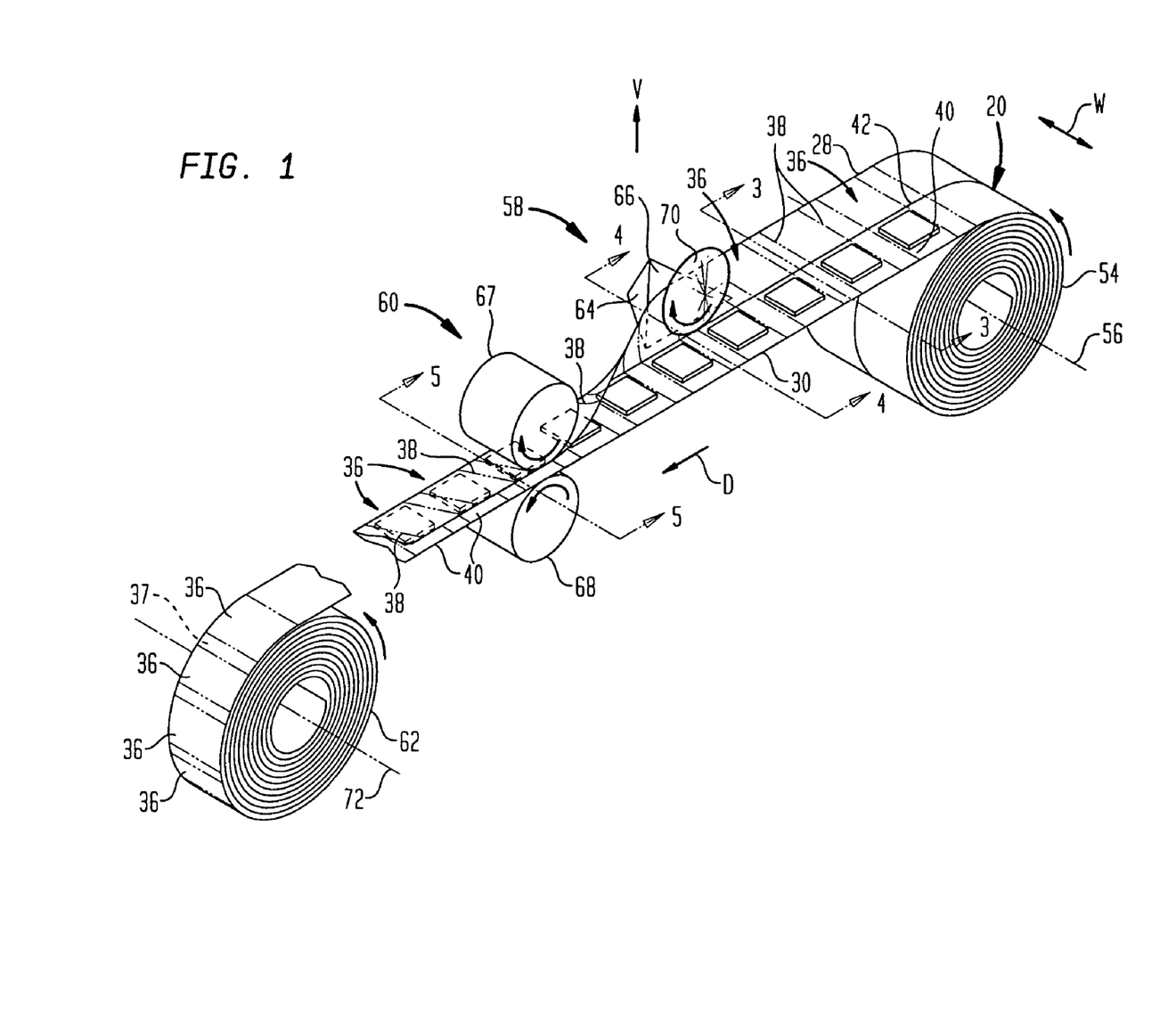
FIG. 1 is a diagrammatic perspective view depicting a strip and processing equipment in a method according to one embodiment of the invention.
Figure 2:
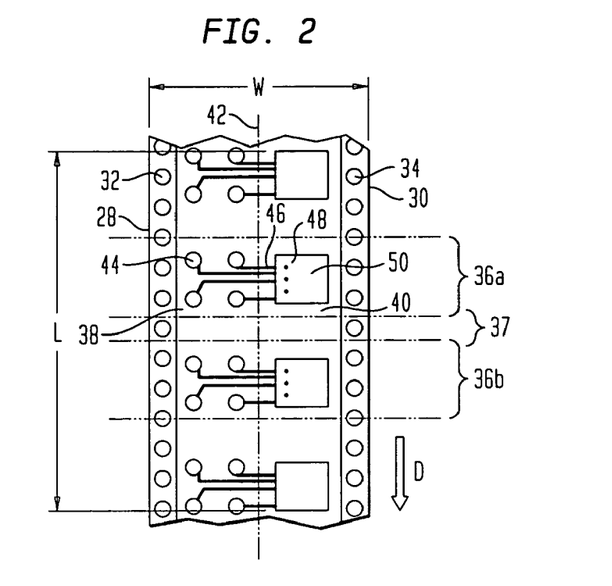
FIG. 2 is a fragmentary, diagrammatic top plan view of the strip shown in FIG. 1.
Figure 3:
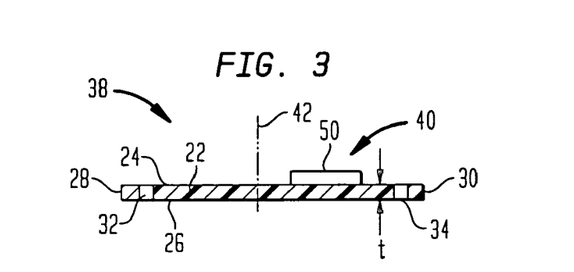
FIG. 3 is a diagrammatic sectional view shown in FIG. 1, taken along line 3—3 in FIG. 1.

A method according to one embodiment of the invention begins with a starting material in the form of a strip or tape 20 shown in perspective view in FIG. 1, in fragmentary plan view in FIG. 2 and in sectional view in FIG. 3. Strip 20 includes a dielectric layer 22 having an inner surface 24, an oppositely-facing outer surface 26, and having first and second edges 28 and 30. The strip has sprocket holes 32 adjacent the first edge 28 and sprocket holes 34 adjacent the second edge 30. The dielectric layer is sheet-like; the dimensions along the surfaces of the dielectric layer, including the widthwise dimension W between the edges 28 and 30 (FIG. 2) and the lengthwise dimension L are substantially greater than the thickness T (FIG. 3) of the layer. The strip includes numerous package element-forming portions 36 arranged along the length of the tape. Each such portion 36 includes a region referred to herein as the lift region 38, occupying that portion of the tape closer to the first edge 28, and a region 40 referred to herein as the guide region, occupying that portion of the strip closer to the second edge 30. The boundary 42 between the lift regions and guide regions normally is not visible in the tape itself, but is shown in FIGS. 2 and 3 solely for purposes of illustration. Likewise, the boundaries of the individual portions 36 also normally are not visible in the strip itself. Each package element-forming portion 36 includes metallic features such as a set of terminals 44 disposed in the lift region 38 and traces 46 extending from these terminals to bond pads 48 in the guide region 40 of the same portion 36. The metallic features may be disposed on either or both surfaces 24 or 26 of the dielectric layer, or within the thickness of the dielectric layer, or both. Terminals 44 are exposed at outer surface 26; where the terminals are disposed on the inner surface 24, holes (not shown) may be provided in the dielectric layer in alignment with the terminals. Although only a few terminals and bond pads are depicted for clarity of illustration, any number of terminals and bond pads may be incorporated in each package element-forming portion 36. Also, each portion 36 may include any other features desired in a packaging element, such as, for example, holes or windows for transmission of energy, electrically conductive ground planes and the like.

At least one microelectronic element, such as a semiconductor die 50, is mounted within the guide region 40 of each package element-forming portion 36. The microelectronic element mounted within each package element-forming portion 36 is electrically connected to the metallic features as, for example, to bond pads 48. Each portion 36 of the strip is adapted to serve as a fold packaging element for the microelectronic element or elements mounted on that portion. The strip may also include intermediate portions 37 (FIG. 2) disposed between adjacent package element-forming portions 36.

In the starting condition, strip 20 is of indefinite length. That is, its lengthwise dimension L is many times greater than its widthwise or lateral dimension W and hence many times greater than its thickness T, and the features of the strip are substantially uniform along the length of the strip. Typically, the length of the strip is greater than the path length traversed by the strip in the process discussed below. In the starting configuration, the strip is supplied on a reel 54, wound in a spiral on the reel and hence wound about the axis 56 of the supply reel.

In the folding method, strip 20 is advanced in a downstream direction D from supply reel 50 past a first folding station 58, also referred to as a lifting station, and a second folding station 60, also referred to herein as a flattening station or additional displacement station, and taken up on a take-up reel 62. The strip may be pulled in the downstream direction by a drive (not shown) connected to take-up reel 62, sprocket wheels or other devices (not shown) engaged with the sprocket holes 32 and 34 of the strip and driven by a drive mechanism (not shown), or in any other convenient manner. Also, the advancing movement of the strip may be continuous or intermittent. In the particular embodiment depicted in FIG. 1, the strip advances along a straight path, and hence the downstream direction at any location along the path is the same. However, as used herein, the downstream direction refers to the direction of advance of the strip. Where the strip advances along a curved path, the downstream direction at any point along the path should be understood as referring to the local direction of advance along the path.

Figure 4:
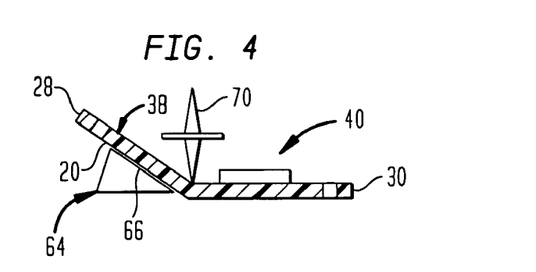
FIG. 4 is a diagrammatic sectional view taken along line 4—4 in FIG. 1.

The lifting station or first folding station 58 includes a ramp or lifting element 64 defining a lifting surface 66. Lifting surface 66 slopes in the upward direction U in the downstream direction. That is, those portions of lifting surface 66 lying further downstream are higher than those portions of the lifting surface lying further upstream. As used herein, the upward direction is a direction transverse to the downstream direction, and also transverse to the widthwise or lateral direction W of the strip. Ramp 64 is positioned so that lifting surface 66 lies within the widthwise or lateral extent of the strip adjacent the first edge 28 of the strip. Thus, as successive package element-forming portions 36 pass downstream with the advancing motion of the strip, successive lift regions 38 will encounter the lifting surface 66. The lifting surface 66 commences below the plane of the strip, but slopes upwardly to above the original plane of the strip. The lifting station 58 also includes a guide element in the form of a wheel or roller 70 disposed above the strip adjacent the boundary 42 between the lift regions 38 and guide regions 40. Thus, as each package element-forming portion 36 passes downstream through folding station 58, the lift region 38 of that portion will be forced upwardly by lifting surface 66, whereas the guide region 40 will be retained against upward motion by guide element 70, so that the lift region 38 is folded upwardly about a fold line adjacent boundary 42, as seen cross-sectional view in FIG.

4. Continued motion of the strip in the downstream direction causes further travel along lifting surface 66, continued elevation of the lift region and further folding.

Figure 5:
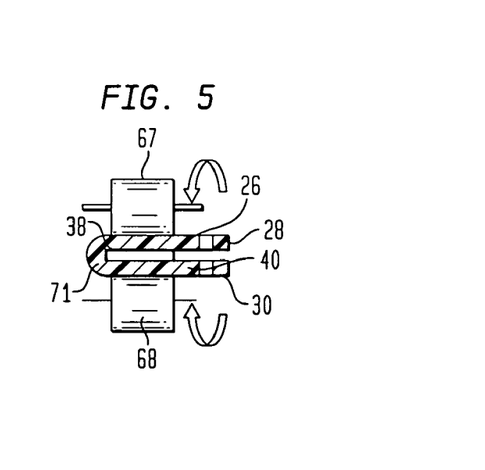
FIG. 5 is a diagrammatic sectional view taken along line 5—5 in FIG. 1

As the strip passes downstream from lift station 58, it encounters flattening or additional movement station 60. Station 60 includes an upper flattening element or roller 67, and a lower flattening element or roller 68, defining a nip therebetween. The strip passes through this nip so that the upper flattening element or roller 67 engages the lift region 38 of each package element region and forces it downwardly, toward the guide region 40 and the lower flattening element 68. Stated another way, the lift region 38 of each package element-forming portion 36 is first lifted by lift surface 66 and then additionally displaced relative to the guide region 40 by the upper flattening element 67. This action brings each package element-forming portion to the configuration depicted in sectional view in FIG. 5, with the lift region 38 superposed over the guide region 40 and with a fold 71 connecting the lift region and guide region, and with the microelectronic element 50 disposed between the fold region and guide region. As the lift region is forced toward the guide region and towards the microelectronic element 50, it may be fastened in place by an adhesive (not shown). The adhesive may be applied to the lift region, to the microelectronic element, or to the guide region during the process, upstream from flattening station 20. Alternatively, the strip may include the adhesive on any or all of these locations at the start of the process. The process equipment may also include stations (not shown) for activating or curing the adhesive. For example, the equipment may include equipment for applying heat to the strip. Also, as the lift region is forced toward the guide region and microelectronic element, the position of the lift region 38 in the lateral direction relative to the guide region 40 and microelectronic element 50 optionally may be controlled by engaging edges 28 and 30 with a guide; by momentarily inserting a guide pin through matching holes in regions 38 and 40, such as in the sprocket holes 32 and 30, or by other measures. The process may optionally include other steps, such as application of an encapsulant before or after folding, and assembly of other elements with the strip. Although this action has been described above with reference to the separate stations and steps, it should be appreciated that the folding action performed by both stations constitutes a progressive process.

The advancing, folded strip at the downstream end of the process is wound onto take-up reel 62 in a spiral around the axis 72 of the take-up reel. The resulting semi-finished article includes a plurality of microelectronic packages, each including a package element formed from a portion 36 of the substrate, folded so as to provide top and bottom runs and a fold portion connecting the runs, and including a microelectronic element attached to one of the runs, such packages being connected to one another so as to form a flexible strip of indefinite length. The strip is bent and wrapped in a spiral, as discussed above, on the reel. In this semi-finished article, the various packages are connected to one another by the connecting portion 37.

The semi-finished article or wound strip can be used to form microelectronic assemblies. In particular, the fold packages can be fed into a further processing station by paying out the strip from the take-up reel. Each package can be detached by severing one package element-forming portion 36 from the strip. This severing operation may be conducted using a shear, punch-and-die set, or other tool which also trims the package to a desired final size. The severing operation and trimming operation may be conducted in conjunction with the operations used to mount the package to a larger assembly as, for example, by solder-bonding the terminals to a circuit board using conventional surface-mounting techniques.

The forming process can operate inexpensively at a high production rate. Moreover, providing the folded packages in a strip of indefinite length simplifies feeding and further processing steps, and thus further contributes to the overall economy of the process.

Figure 6:
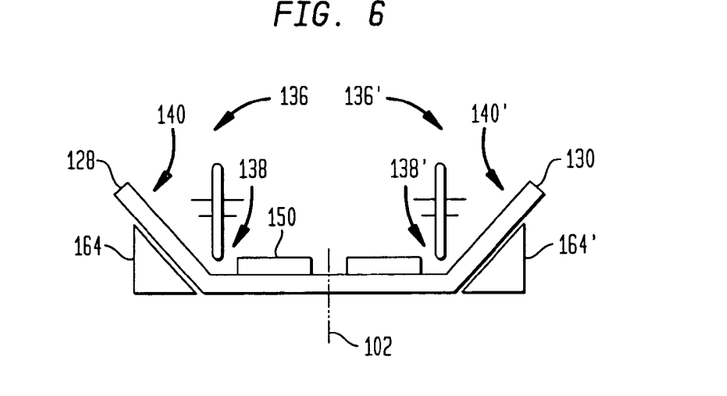
FIG. 6 is a diagrammatic sectional view depicting a strip and processing equipment in a method according to a further embodiment of the invention.

Numerous variations of the features discussed above with reference to FIGS. 1–5 can be employed. For example, in the embodiment of FIGS. 6 and 7, the strip in its starting form includes pairs of package element-forming portions 136 and 136', disposed side-by-side. Each package element-forming portion 136 includes a guide region 138, whereas each package element-forming portion 136' includes a guide region 138', the guide regions adjoining one another along a border 102. Each portion 136 includes a lift region 140 disposed adjacent the first edge of the strip, whereas each portion 136' includes a lift region 140' adjacent the second edge of the strip. These elements are lifted by lifting elements 164 and 164' (FIG. 6) and folded by flattening or additional movement elements 166 and 168 (FIG. 7) to form two packages side-by-side along each portion of the length of the strip. The strip can be wound onto a take-up reel in this condition and subsequently severed along its length, along a border 102 between the packages, i.e., between the guide sections 138 and 138'. Alternatively, the strip can be severed along its length downstream from the folding stations so as to provide two separate strips, each including a series of packages as discussed above.

Figure 7:
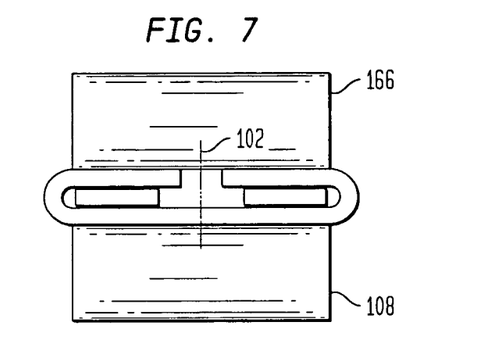
FIG. 7 is a diagrammatic sectional view of the strip shown in FIG. 6 at a later stage of the method.

In yet another alternative embodiment, the doubly-folded strip shown in FIG. 7 may be used as is, to provide a series of packages, each of which includes two folds at opposite edges.

Figure 8:
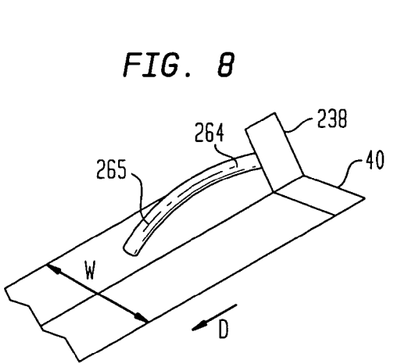
FIG. 8 is a fragmentary, diagrammatic view of processing equipment used in a further embodiment of the invention in conjunction with a portion of a strip.

In a further variant, the step of additionally displacing a lift region after lifting may be performed in whole or in part by an element having a laterally-sloping surface 265 (FIG. 8) sloping inwardly in the lateral or widthwise direction W, in the downstream direction. This element may be disposed downstream from the upwardly-sloping lifting surface 264 so that as each lift region 238 passes downstream, it is first lifted or displaced upwardly by lifting surface 264 and then forced laterally, toward the corresponding guide region 40 in the lateral direction by surface 265. Surfaces 264 and 265 may be continuous with one another, and may be generally in the form of a section of a helix having an axis extending the downstream direction.

Figure 9:
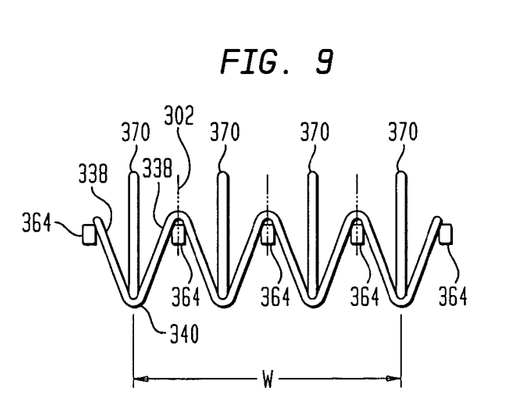
FIG. 9 is a diagrammatic sectional view of a strip and processing equipment in accordance with yet another embodiment of the invention.

In a further variant (FIG. 9), numerous lifting elements 364 are arrayed across the original widthwise or lateral extent of the strip, and numerous guide elements 370 are also arrayed across the width or lateral extent of the strip, the guide elements being interspersed between the lifting elements, so that each guide element engages narrow guide regions of the strip disposed between two lifting elements. In this arrangement, as the strip travels downstream, the lift regions 338 on opposite sides of each guide region 340 are displaced upwardly relative to the guide regions. Although not seen in FIG. 9, the lift elements and guide elements desirably converge with one another in the downstream direction so as to compensate for the progressively narrowing overall width of the strip. In this arrangement, each package element-forming portion includes two lift regions 338 connected to one another by a guide region 340. The two lift regions form the opposed runs of the package, whereas the guide region forms the fold extending between these runs. This arrangement will produce a strip including numerous packages disposed side-by-side. At the downstream end of the folding apparatus, the strip may be severed along boundaries 302 between adjacent lift regions so as to form individual strips. These strips may be wound individually into a spiral form, as discussed above.

In the embodiments discussed above with reference to FIGS. 1–5, the microelectronic elements are mounted on the guide region and remain in the original plane of the strip, whereas the terminals are disposed in the life regions. This arrangement can be reversed. Also, in the arrangements discussed above, the strip is supplied with microelectronic elements already mounted thereon in a previous process. In a variant, the microelectronic elements can be applied to the strip during the process, typically upstream of the folding stations. In a further variant, the microelectronic elements can be mounted to the outer surface of the strip, so that the microelectronic elements are positioned on the outside of the folded package, rather than between the runs. Also, the folding process can be performed without microelectronic elements mounted to the strip. Such a process can be used, for example, where the microelectronic elements are to be mounted on the outside of the folded package, rather than between the top and bottom runs of the package.

Figure 10:
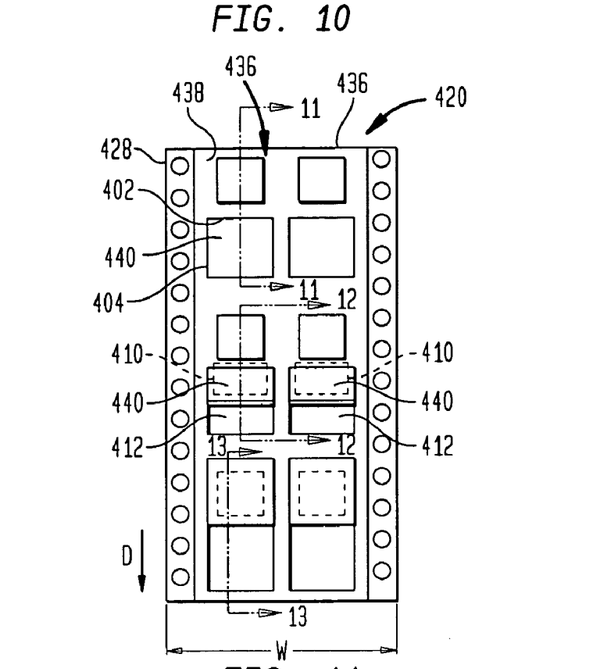
FIG. 10 is a diagrammatic top plan view of a strip used in a method according to a further embodiment of the invention, with portions of the strip shown at different stages of processing.
Figure 11:
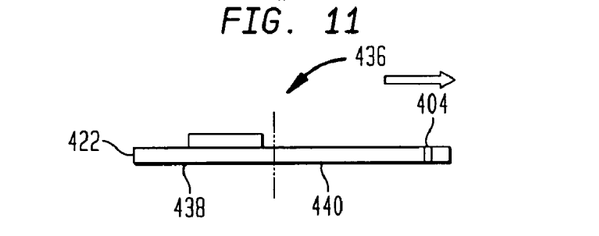
FIG. 11 is a sectional view taken along line 11—11 in FIG. 10.

A strip 420 used in a further embodiment of the invention incorporates dielectric layer 422. The strip includes a plurality of package element-forming portions 436 (FIGS. 10 and 11). Here again, each package element-forming portion includes the elements in the package element for a fold package, such as traces, terminals and other metallic components, (not shown), as well as a dielectric layer or layers. The strip desirably is of indefinite length, and desirably is supplied on a reel, as discussed above. In the starting condition, seen in plan view adjacent the top of FIG. 10 and seen in sectional view in FIG. 11, each portion 436 includes a base region 438 and a flap 440 connected to the base region at a juncture 402 between the base region 438 and flap 440. Each flap 440 is bounded by a gap 404 extending through the dielectric layer. Gap 404 may be completely continuous or else may be interrupted by small, weak frangible webs (not shown) extending between the flap and the surrounding regions of the strip. As seen in FIG. 10, each juncture region 402 extends in the widthwise or lateral direction of the strip, and each flap 440 extends downstream from its juncture 402 with the base region. Stated another way, the junctures 402 are parallel with one another and extend in the lateral or widthwise direction W of the strip.

Figure 12:
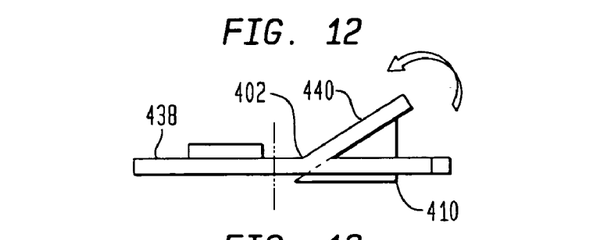
FIG. 12 is a diagrammatic sectional view taken along line 12—12 in FIG. 10, depicting the strip in conjunction with processing equipment.
Figure 13:
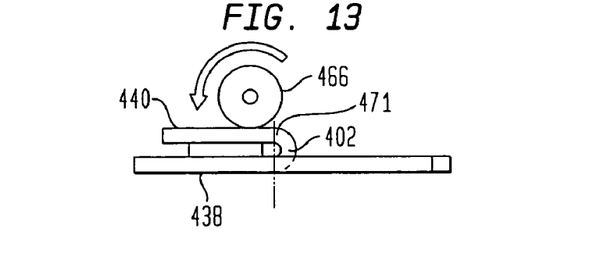
FIG. 13 is a diagrammatic sectional view taken along line 13—13 in FIG. 10, depicting the strip in conjunction with processing equipment.

In the folding process, the strip is advanced lengthwise in a downstream direction D, as discussed above. At a first folding station, a lifting tool 410, seen in plan view in FIG. 10 and in sectional view in FIG. 12, is advanced upwardly from beneath the strip so that the lifting tool 410 engages each flap 440 and bends the flap upwardly relative to the other regions of the tape. In the embodiments of FIGS. 10 and 12, separate lifting tools engage separate flaps 440. Each lifting tool moves upwardly into a hole 410 in the strip, in the region formerly occupied by the flap 440. The lifting tools are retracted downwardly, below the strip, before continued advance of the strip brings the base regions 438 downstream over the lifting tools. The flaps 440, however, remain in the upwardly projecting, partially bent configuration illustrated in FIG. 12, so that each flap projects upwardly from the base region 438 and from other regions of the strip. As each package element-forming portion 436 advances further downstream, it encounters an additional displacement or flattening station 460 including an upper flattening element which, in this instance, is a roller 466. The additional displacement or flattening station may include an additional roller (not shown) disposed beneath the path of the strip, so that the rollers cooperatively define a nip similar to that discussed above with reference to FIG. 1. The upper flattening element 466 catches the upwardly-projecting flap as the strip moves downstream and bends it backwards in the upstream direction around juncture 402, thus forming a package with one run consisting of the flap 440, another run consisting of the base region 438 and a fold 471. This process also can include the optional steps discussed above, such as the use of an adhesive and additional assembly steps. Additional elements such as guide pins optionally may be used to constrain each flap with respect to the associated base portion.

The base region of each folded package is linked to the other packages in the completed strip by the remaining portions of the strip. The strip of packages formed in this manner can be handled in substantially the same way as the strips discussed above. Here again, the strip can be wound on a reel or otherwise stored in its indefinite length form and further processed, as by severing the individual packages from the strip. Although the particular strip illustrated in FIG. 10 includes only two columns of package element-forming portions 436 disposed across the width of the strip, any number of package element-forming portions can be provided. In a further variant, the individual flaps 440 disposed side-by-side in a row extending across the width of the strip may be merged with one another into a single, larger flap. This larger flap is folded and bent in the manner discussed above with reference to FIGS. 10–13 as, for example, by using a single large lifting tool to bend the entire flap upwardly. The individual packages can be severed from one another after such folding. In a further variant, the flaps 440 may not project downstream or lengthwise from the base regions 438 in the starting condition of the strip. Stated another way, junctures 402 may not extend in the widthwise direction. In this embodiment, the lifting tools can lift the flaps in the same manner as discussed above with reference to FIG. 12, but the additional displacement or flattening tool should be provided with a component of motion in the lateral direction of the strip, so that the motion of the flattening tool relative to the strip includes a component of motion in a direction opposite to the direction of projection of the flap. For example, if the flap projects toward edge 428 (to the left in FIG. 10) in the starting condition of the strip, the additional displacement or flattening tool should move relative to the flap in the direction away from edge 428, to the right in FIG. 10. For example, a laterally-sloping surface such as surface 265 can be used. In yet another variant, the flaps may be arranged so that they project upstream, or rearwardly along the length of the strip, from their junctures with the base portions. In this arrangement, the lifting tool again can operate in the manner discussed above, but the additional displacement or flattening tool should move downstream relative to the strip.

Figure 14:
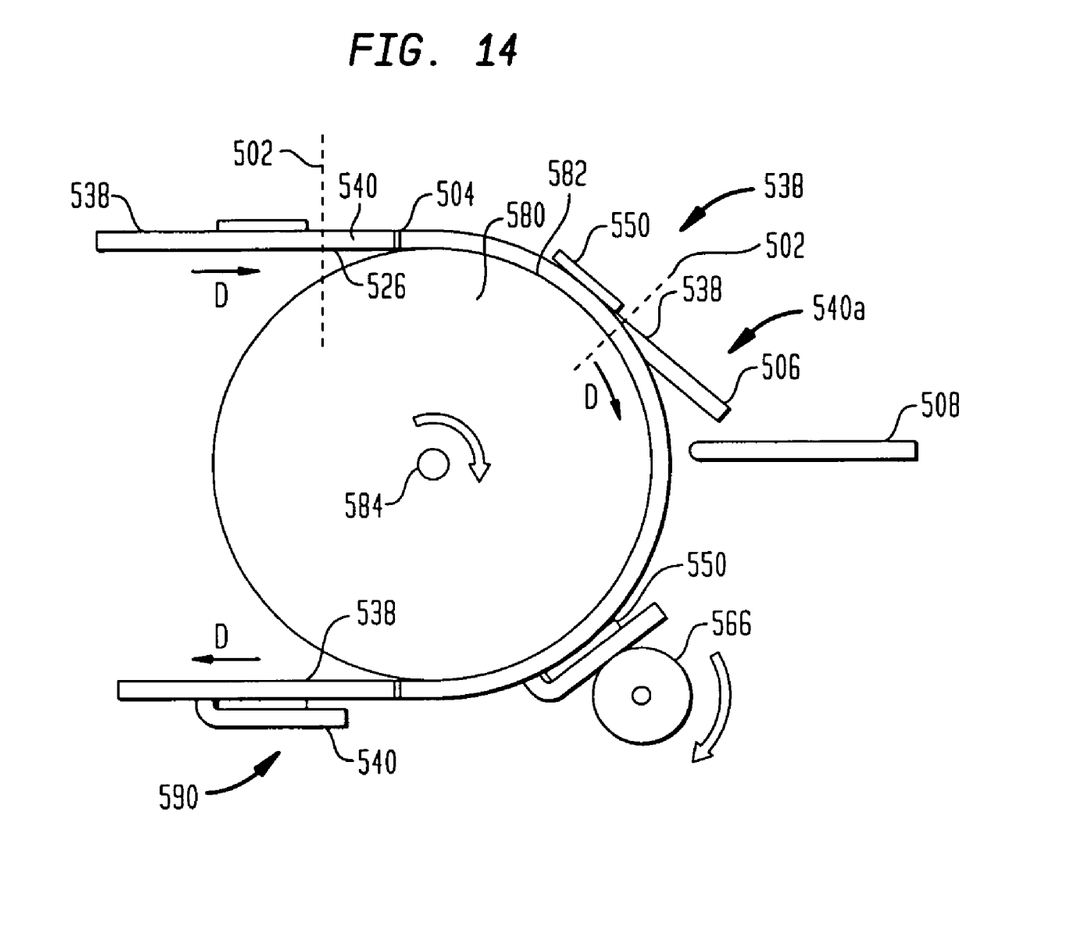
FIG. 14 is a diagrammatic elevational view of a strip and processing equipment in accordance with yet another embodiment of the invention.

In a further variant (FIG. 14), the strip, in its starting configuration, includes base regions 538 and flaps 540, similar to those discussed above with reference to FIG. 10. Here again, each flap 540 projects in the lengthwise direction of the strip, and the junctures 502 extend laterally across the strip. The strip is advanced with each flap 540 leading the associated base region 538, i.e., with the flaps 540 pointing downstream from the associated base regions 538. As the tape is advanced downstream, it passes over a curved member 580 in the form of a cylindrical drum having a curved surface 582, which in this embodiment is a surface of revolution about a laterally-oriented axis 584. In the embodiment illustrated, the drum is rotatable about axis 584, so that surface 582 moves downstream with the strip at a surface speed equal to the speed of downstream motion of the strip. As the strip passes downstream and bends around curved surface 582, those portions of the strip other than the flaps bend in conformity with the surface 582 of the curved element. However, because each flap 540 is only attached to the remaining portions of the strip at its juncture 502 with the associated base portion, the flaps 540 do not bend into conformity with the curved surface 582. Thus, each flap 540 tends to remain straight and thus projects upwardly, in a direction transverse to the downstream direction D and transverse to the widthwise or lateral direction of the strip, relative to the other portions of the strip and hence relative to the base portion 538. Stated another way, bending the other portions of the strip around curved surface 582 causes the flaps to bend upwardly away from such other portions, as shown, for example, by flap 540a (FIG. 14). With additional movement of the strip in the downstream direction, around drum 580, the upwardly-projecting tips or downstream extremities 506 of the upwardly-projecting flaps encounter a fixed element 508 in the form of a blade disposed above the strip. As the strip continues to advance, the extremity 506 of each flap is forced rearwardly, or in the upstream direction, relative to the associated base portion 538, while thus bending the flap back over the base portion and over the microelectronic element 550 mounted on the base portion. A further flattening element in the form of a roller 566 completes the folding process, leaving the strip with packages 590, each including a bottom run formed from the base element 538 and a top run formed from the flap 540. This strip also can be handled and processed in the manner discussed above.

In the embodiments discussed above which use flaps, the flaps may be provided in the starting strip, or may be formed during the process, as by punching, laser ablating or otherwise treating the strip to form the gaps and thus define the flaps prior to the flap-bending step.

The process of FIG. 14 can include the optional features discussed above. In a variant of the approach shown in FIG. 14, curved surface 502 may be stationary, so that the bottom or outer surface 526 of the strip slides over the curved surface.

A further aspect of the further invention provides techniques for dealing with die shrink. Die shrink, as referred to herein, refers to the common practice in the microelectronics industry of progressively reducing the size of semiconductor dies during production of a die having a given function. That is, when a die manufacturer first produces dies of a given function, the dies may have relatively large horizontal dimensions. As the manufacturer gains expertise in production of the particular die, the manufacturer, or a competitor, typically is able to make the die with smaller horizontal dimensions, but with the same function. However, it may not be economically feasible or desirable to change the substrate used to form a folded package. Typically, the terminals used to secure the folded package containing a later-generation, smaller-size die to a circuit board should be disposed in the same pattern as the terminals on the package used to contain the larger earlier-generation die having the same function.

In a method according to a further embodiment of the present invention, a first set of fold packages is produced using a package element 600 (FIG. 17) having bond pads 602, or other features adapted for connection to a semiconductor die. These features 602 are disposed at a predetermined location relative to terminals 604, the bond pads being connected to the terminals by traces extending along the package element. The package element 600 is folded so as to define a top run 606 and a bottom run 608, the terminals 604 being disposed on the bottom run. The bond pads 602, thus, lie at a preselected distance $D_B$ from the fold. In the embodiment depicted in elevational view in FIG. 17 and shown in plan view in FIG. 18, the package element incorporates a hole 610 for transmission of acoustic energy to the interior of the package. After folding, the hole 610, bond pads 602 and terminals 604 are all disposed in a first zone $Z_1$ of the package, adjacent to the fold 612.

Figure 15:
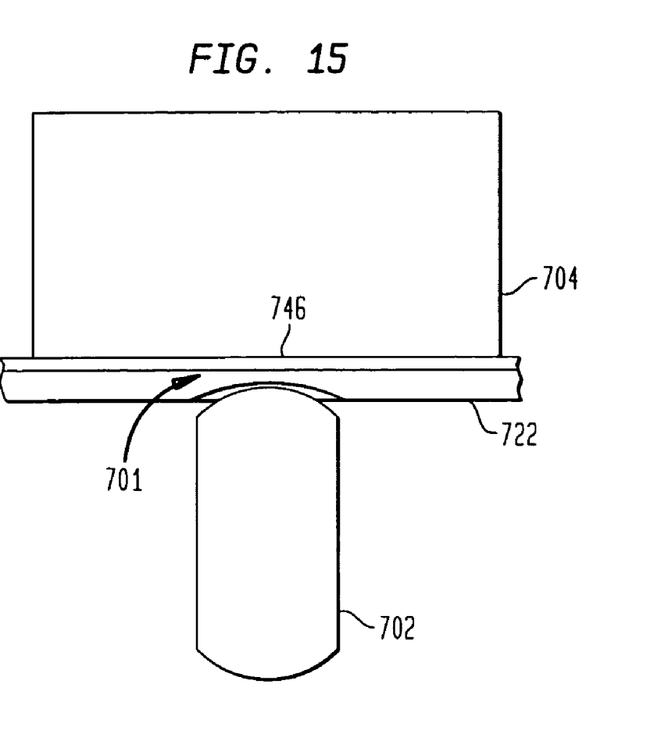
FIG. 15 is a diagrammatic sectional view on an enlarged scale showing portions of a strip and processing equipment according to yet another embodiment of the invention.
Figure 16:
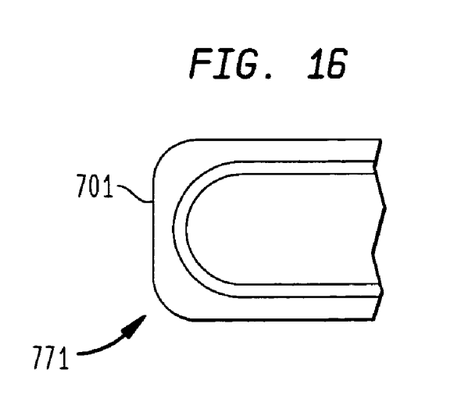
FIG. 16 is a fragmentary, diagrammatic sectional view depicting portions of a fold package made using the strip and equipment of FIG. 15.

Folding processes such as those discussed above can be facilitated by providing the substrate to be folded with a relatively weak section at the location where folding is to occur. Such section desirably is elongated and has less resistance to bending about its axis of elongation than the adjacent sections. For example, such weak sections may extend along the boundary 42 between the lift regions and guide regions in the embodiment of FIGS. 1–5 or along the junctures 402 (FIG. 10) between the flaps and base portions. Such weak sections 701 can be formed by indenting the substrate with a tool 702 (FIG. 15). Where the substrate includes a dielectric layer 722 and a layer of metallic features 746, the indentation desirably is formed in the dielectric layer. The indentation in the dielectric layer can be made without indenting the metallic layer, so as to prevent damage to the metallic layer. However, particularly where the metallic layer is relatively thick or where the metallic layer covers a large portion of the surface of the dielectric, it may be desirable to indent the metallic layer in addition to indenting the dielectric layer, or in lieu of indenting the dielectric layer, to assure that the fold occurs at the indentation. The indentation process may be performed at any time prior to folding. Where the fold axes are parallel to the direction of advance of a strip-like substrate, the indentation tool 702 may be in the form of a roller having a convex surface and an axis of rotation extending transverse to direction of advance. A backup roller 704 may form a nip with roller 702. In other embodiments, the indenting tool may be a reciprocating die having a convex ridge, such die being moved into and out of engagement with the substrate. In still other embodiments, the weak section can be formed by selectively patterning metallic features. For example, where the substrate includes a metallic ground plane, such ground plane can be solid in areas outside of the weak section and can have holes within the weak section. As seen in FIG. 16, the substrate is folded so that the weak section 701 forms the fold in the package.

Figure 17:
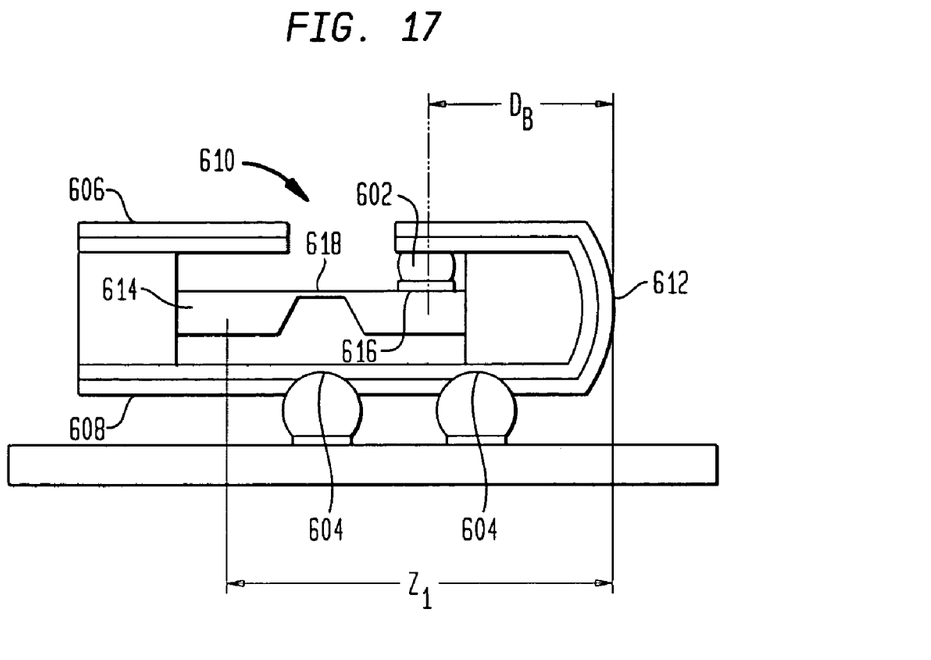
FIG. 17 is a diagrammatic, sectional elevational view depicting a package made in one stage of a method according to yet another embodiment of the invention.
Figure 18:
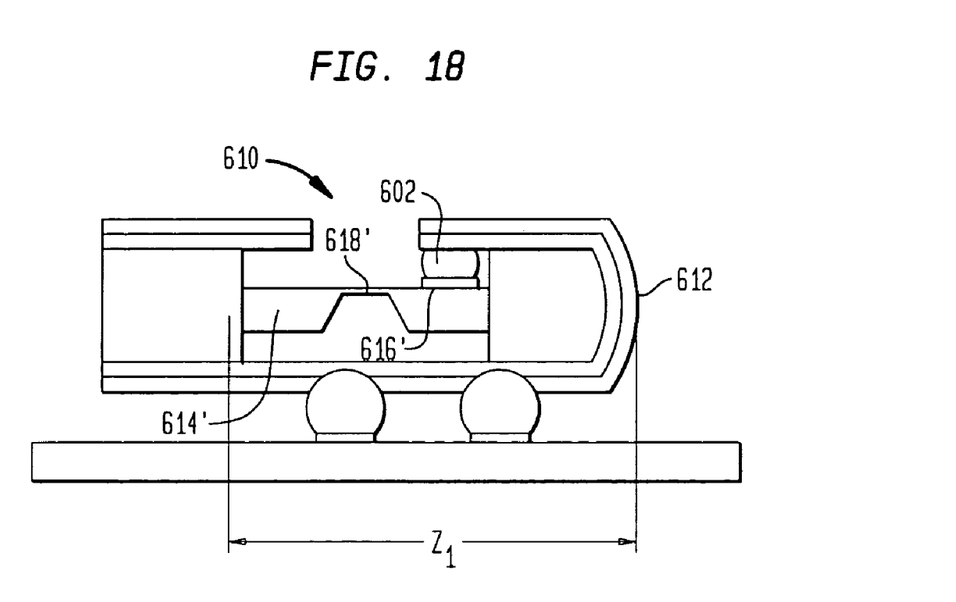
FIG. 18 is a view similar to FIG. 17, but depicting a package made in a different stage of the method of FIG. 17.

A first set of packages is made using this package element and using first semiconductor dies 614. These dies have relatively large horizontal dimensions, and thus extend relatively far from fold 612 and outside of zone Z1 when the contacts 616 of the dies are bonded to the bond pads 602 of the package element and the package element is folded, as illustrated. Also, each die 614 has a sensitive region such as an acoustically-sensitive region 618. The acoustically-sensitive region 618 is displaced slightly from the center of hole 610, but still in acceptable alignment with the hole. A large number of such first packages can be manufactured using the same package element and folding procedures.

In a further step of a method according to this embodiment of the invention, additional packages are manufactured using the same package element, but using second dies 614' (FIG. 16) having smaller horizontal dimensions. Second dies 614' have contacts 616' disposed in the same pattern as the contacts 616 on the first dies. Thus, the contacts 616' can be bonded to the same features 602 on the same package element. However, the smaller, second die 614 does not project as far from the fold 612 in the package element as the first die 614; the entirety of the second die 614' lies within the first zone $Z_1$ of the package. This leaves some excess portions of the package element which can be trimmed away if desired, or can be left in place. The distance between the sensitive element 618' and contact array 616' of the second dies is less than the comparable distance between the sensitive element 618 and contacts 616 of the larger, first dies. Because the contacts 616' of the second dies are bonded to the bond pads 602 of the package element, the bond pads 616' of the second dies are disposed in the same location relative to hole 610 as the contacts 616 of the first dies. However, because of the smaller distance between contacts 616' and sensitive element 618', the sensitive element is displaced, relative to hole 610 and other features of the folded package element. In this case, the displacement causes the sensitive area 618 of the second die to be in better alignment with hole 610 than the sensitive areas 618 of the first dies. This can be helpful, inasmuch as a smaller second die may have somewhat lower sensitivity to acoustic energy.

As these and other variations and combinations of the features discussed above can be utilized, the foregoing description of the preferred embodiments should be taken by way of illustration rather than by limitation of the present invention.

The invention claimed is:

1. A method of forming a plurality of microelectronic packages including the steps of:
  (a) advancing a strip of a sheetlike substrate in a downstream direction through one or more folding stations so that in the advancing step, the strip moves relative to the one or more folding stations to thereby convey successive portions of the substrate through the one or more folding stations; and
  (b) at said one or more folding stations, folding said substrate so that plural portions of the substrate form plural folded packaging elements, each including a top run and a bottom run.

2. The method as claimed in claim 1 wherein said strip bears a plurality of microelectronic elements so that each said folded packaging element bears at least one of said microelectronic elements.

3. The method as claimed in claim 2 wherein said folding step is performed so that said top and bottom runs of each said folded packaging element extend on opposite sides of at least one said microelectronic element.

4. The method as claimed in claim 1 wherein said substrate has lateral directions transverse to said downstream direction, and wherein said folding step includes engaging successive lift regions of the strip with at least one lifting element defining at least one surface extending in said downstream direction and sloping in an upward direction transverse to said downstream and lateral directions, so that as each such lift region moves downstream, such lift region will be lifted progressively upwardly by such lifting element.

5. The method as claimed in claim 4 wherein said folding step further includes engaging guide regions of the substrate laterally offset from said lift regions with one or more guide elements disposed above the strip so that said guide elements limit upward movement of the guide regions, whereby said substrate is folded about one or more fold axes extending in said downstream direction.

6. The method as claimed in claim 5 wherein said folding step further includes additionally displacing said lift regions as such regions pass downstream from said at least one lifting element.

7. The method as claimed in claim 6 wherein said additionally displacing step includes engaging said lift regions with at least one forming element having a surface sloping laterally in said downstream direction.

8. The method as claimed in claim 6 wherein said additionally displacing step includes engaging said lift regions with one or more upper flattening elements disposed above said guide regions.

9. The method as claimed in claim 6 wherein said additionally displacing step includes squeezing said lift regions and said guide regions in at least one nip between at least one pair of opposed flattening elements.

10. The method as claimed in claim 4 wherein said lift regions are disposed at one or more edges of the strip.

11. The method as claimed in claim 1 wherein said folding step includes lifting a series of flaps in said substrate so that each flap is bent relative to other regions of the substrate about a juncture between the flap and such other regions and so that portions of the flap remote from such juncture are lifted upwardly away from such other regions.

12. The method as claimed in claim 11 wherein said lifting step is performed by moving at least one lifting tool upwardly, at least partially through the substrate in regions of the substrate occupied by the flaps.

13. The method as claimed in claim 11 wherein the junctures between said flaps and other regions of the substrate are substantially linear and parallel to one another, and wherein said lifting step includes bending said other regions of the strip downwardly about an axis parallel to said linear junctures.

14. The method as claimed in claim 13 wherein said linear junctures extend laterally, transverse to said downstream direction, and wherein said advancing step includes advancing the strip around a curved member having an axis of curvature extending laterally so that said other regions of said strip bend about said axis of curvature as the strip is advanced downstream.

15. The method as claimed in claim 14 wherein said curved member is a drum in the form of a surface of revolution about said axis of curvature, the method further comprising the step of rotating said drum about said axis of curvature as the strip advances downstream.

16. The method as claimed in claim 11 wherein said folding step further includes additionally displacing said flaps after said upward bending step.

17. The method as claimed in claim 16 wherein said additionally displacing step includes engaging said flaps with one or more upper flattening elements disposed above said other regions.

18. The method as claimed in claim 17 wherein, prior to said upward bending step, each said flap projects in said downstream direction from the juncture between such flap and the other regions of the substrate.

19. The method as claimed in claim 11 wherein, prior to said upward bending step, said substrate includes gaps between each said flap and the other regions of the substrate, said gaps at least partially defining borders of such flap remote from the juncture between such flap and the other regions of the substrate.

20. The method as claimed in claim 19 further comprising forming said gaps during said advancing step.

21. The method as claimed in claim 20 wherein said step of forming said gaps is performed at one or more stations upstream of said at least one lifting tool.

22. The method as claimed in claim 19 wherein said substrate includes said gaps prior to said advancing step.

23. The method as claimed in claim 1 wherein said advancing step is performed so that said strip advances continuously in said downstream direction.

24. The method as claimed in claim 1 wherein said advancing step is performed intermittently.

25. The method as claimed in claim 1 wherein said advancing step includes winding said strip, after said folding step, onto a take-up reel.

26. The method as claimed in claim 1 or claim 25 wherein said advancing step includes feeding said strip from a feed reel.

27. The method as claimed in claim 1 wherein said substrate, immediately prior to said folding step, includes one or more relatively weak sections, said weak sections being less resistant to bending than adjoining sections of said substrate.

28. The method as claimed in claim 27 further comprising the step of forming said weak sections at one or more weakening stations upstream of said at least one folding station, said advancing step being performed so as to feed said strip through said one or more weakening stations.

29. The method as claimed in claim 28 wherein said substrate includes a dielectric layer and a metallic layer, said step of forming said weak sections including indenting said dielectric layer.

30. The method as claimed in claim 29 wherein said step of indenting said dielectric layer is performed without indenting said metallic layer.

31. A method of forming a microelectronic package comprising (a) providing a substrate having a one or more elongated, relatively weak sections, each said weak section having an axis of elongation, each said weak section being less resistant to bending about its axis of elongation than adjoining sections of said substrate;

(b) securing one or more microelectronic elements to said substrate; and (c) folding portions of said substrate at said relatively weak sections to form one or more package elements, each said package element including a top run, a bottom run and a fold connecting said top and bottom runs, said securing and folding steps being performed so that each said package element has one or more of said microelectronic elements attached to one or both of said top and bottom runs.

32. The method as claimed in claim 31 wherein said providing step includes the step of forming said weak sections immediately prior to said folding step.

33. The method as claimed in claim 31 wherein said substrate includes a dielectric layer and a metallic layer, and wherein said providing step includes the step of forming said weak sections by indenting said dielectric layer.

34. The method as claimed in claim 33 wherein said indenting step is performed without indenting said metallic layer.

* * * * *